(12) United States Patent
Ozawa et al.

(10) Patent No.: US 7,984,345 B2
(45) Date of Patent: Jul. 19, 2011

(54) TEST APPARATUS AND TEST METHOD

(75) Inventors: Taiki Ozawa, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 972 days.

(21) Appl. No.: 11/857,453

(22) Filed: Sep. 19, 2007

(65) Prior Publication Data

US 2008/0052015 A1 Feb. 28, 2008

Related U.S. Application Data

(63) Continuation of application No. PCT/JP2007/055879, filed on Mar. 22, 2007.

(30) Foreign Application Priority Data

Apr. 6, 2006 (JP) ................................. 2006-105394

(51) Int. Cl.
*G11C 29/00* (2006.01)
*G11C 7/00* (2006.01)

(52) U.S. Cl. ........................................ 714/723; 365/201

(58) Field of Classification Search ............ 714/718–723
See application file for complete search history.

(56) References Cited

U.S. PATENT DOCUMENTS

| | | | |
|---|---|---|---|
| 6,185,134 B1 | 2/2001 | Tanaka | |
| 6,549,459 B2 | 4/2003 | Higuchi | |
| 7,430,693 B2 * | 9/2008 | Noguchi et al. | ............... 714/710 |
| 2004/0223358 A1 | 11/2004 | Yamamoto | |
| 2005/0041553 A1 * | 2/2005 | Aizawa | ....................... 369/59.17 |
| 2005/0050410 A1 * | 3/2005 | Pomaranski et al. | ......... 714/723 |
| 2005/0286308 A1 | 12/2005 | Nagashima | |

FOREIGN PATENT DOCUMENTS

| | | |
|---|---|---|
| JP | 2000-173289 | 6/2000 |
| JP | 2002-133892 | 5/2002 |
| JP | 2002-140899 | 5/2002 |
| JP | 2004-220068 | 8/2004 |
| JP | 2005-056394 | 3/2005 |
| JP | 2006-012367 | 1/2006 |
| JP | 2006-134482 | 5/2006 |
| KR | 1999-029646 | 4/1999 |

OTHER PUBLICATIONS

"Search report of Europe counterpart application", issued on Sep. 25, 2009, p. 1-p. 10.

* cited by examiner

*Primary Examiner* — John P Trimmings
*Assistant Examiner* — Daniel F McMahon
(74) *Attorney, Agent, or Firm* — Jianq Chyun IP Office (57) ABSTRACT

A test apparatus compares bits included in a data sequence read from a DUT with expectation values. Comparison results are stored in a first failure memory (FM) as bit information indicating whether storage cells of the DUT are non-defective. The storage device counts the number of bits not matching the expectation values for each page, and judges for each grade/page of the DUT whether the number of bits not matching the expectation values meets the condition of that grade. Judgment results are stored in a second FM as page information indicating whether each page is non-defective for each grade. If page information of a page including a bit corresponding to a storage cell indicating that this page meets the condition of any grade is stored in the second FM, the apparatus outputs the bit information in the first FM, by changing it to a value indicating that storage cell is as non-defective.

6 Claims, 6 Drawing Sheets

GRADE 2 (ECC2bit)

GRADE 1 (ECC1bit)

GRADE 0 (NO ECC)

PAGE DIRECTION

FIG. 6

TEST APPARATUS AND TEST METHOD

CROSS REFERENCE TO RELATED APPLICATIONS

This is a continuation application of PCT/JP2007/55879 filed on Mar. 22, 2007 which claims priority from a Japanese Patent Application(s) NO. 2006-105394, filed on Apr. 6, 2006, the contents of which are incorporated herein by reference.

BACKGROUND

1. Field of the Invention

The present invention relates to a test apparatus and test method for an electronic device. Particularly, the present invention relates to a test apparatus and test method for testing a memory under test which stores, in each of its pages, a data sequence affixed with an error check and correction.

2. Relate Art

A test apparatus for a semiconductor memory logically compares an output from a memory under test with an expectation value in each test cycle, and detects the memory as having passed the test in a case where the compared values match each other while detects it as having failed if they do not match. Hence, if only one failure at all is detected from such kind of memory under test as a flash memory, from which its stored data is read out in the unit of page in one cycle after another, and which is affixed with an error check and correction in each of its pages, this memory under test is detected as defective as well.

Here, a flash memory might have an impermanent soft error, with a program disturbing mode occurring to force data to be rewritten in the storage cells other than those secured for writing data. See a non-patent literature 1 given below, as for the occurrence of such an error. If such a software error occurs in an actual use, the memory controller that controls the flash memory corrects the error in the data read out from the flash memory.

Thus, in a test on a flash memory, if an error within the limit in which errors can be corrected with an error check and correction occurs, this memory under test should be judged as an article that can pass the test. However, it should be noted that some flash memories may be liable to have errors due to software errors as described above while other flash memories may not include even a defect of 1 bit. Hence, someone might request that flash memories that can operate normally be classified according to how safe they are from occurrence of errors, in order to determine their applications or their prices when sold.

[Non-Patent Literature 1] Koji Sakuta, 'Large-capacity NAND flash memory techniques for the age of Silicon Movie', FED Journal, Vol. 11, No. 3, 2000, pp. 76-88

In order that flash memories may be classified according to how safe they are from occurrence of errors, the number of errors which occur in each page is counted page by page, and this count number is judged as to whether it meets a predetermined quality standard. A repair process for replacing defective storage cells with spare storage cells is given to any pages that do not satisfy the quality standard. If any flash memory reaches the quality standard after the repair process, it will be classified into the grade corresponding to the quality standard.

In order to enable this classification, it is a possible way to acquire from the test apparatus data for all storage cells included in all pages about whether they have passed or failed and analyze the data by human labor or by computer. However, analyses cost much labor and time since there are an enormous number of storage cells. Some of the acquired data may be found useless because some pages have originally met the quality standard and require no repair process.

SUMMARY

Hence, according to one aspect of the innovation included herein, an object is to provide a test apparatus and test method which can solve the above-described problem. This object will be achieved by combinations of features recited in independent claims in the scope of claims. Dependent claims will define additional advantageous specific examples of the present invention.

That is, according to one exemplary test apparatus according to an aspect related to the innovation included herein, there is provided a test apparatus which tests a memory under test storing, in each of its pages, a data sequence affixed with an error check and correction, the test apparatus including: a test processing section which reads out, for each page, which is a unit of error correction, the data sequence stored in that page from the memory under test; a logical comparator which compares a value of each bit included in the data sequence read out from the memory under test with an expectation value of that bit; a first failure memory which stores, for each storage cell of the memory under test, bit pass/failure information indicating whether that storage cell is good or defective, based on a result of comparison by the logical comparator; a data error counting section which counts, for each page, a number of bits that do not match the expectation value; a page classifying section which judges, for each page and for each of a plurality of grades into which the memory under test is classified based on its quality, whether the number of bits that do not match the expectation value meets a condition of that grade; a second failure memory which stores, for each of the plurality of grades, page pass/failure information indicating whether each page is good or defective, based on a result of judgment by the page classifying section; and an output section which, in outputting the bit pass/failure information of each storage cell for each of the plurality of grades, if it is satisfied that the page pass/failure information of a page including a bit corresponding to that storage cell indicating that this page meets the condition of that grade is stored in the second failure memory, outputs the bit pass/failure information output from the first failure memory and indicating that that storage cell is defective, by changing the bit pass/failure information to a value indicating that that storage cell is not defective.

According to one exemplary test method according to an aspect related to the innovation included herein, there is provided a test method for testing a memory under test which stores, in each of its pages, a data sequence affixed with an error check and correction, the test method including: reading out, for each page, which is a unit of error correction, the data sequence stored in that page from the memory under test; comparing a value of each bit included in the data sequence read out from the memory under test with an expectation value of that bit; storing, for each storage cell of the memory under test, bit pass/failure information indicating whether that storage cell is good or defective in a first failure memory, based on a result of comparison; counting a number of bits that do not match the expectation value, for each page; judging, for each page and for each of a plurality of grades into which the memory under test is classified based on its quality, whether the number of bits that do not match the expectation value meets a condition of that grade; storing, for each of the plurality of grades, page pass/failure information indicating whether each page is good or defective in a second failure memory, based on a result of judgment; and in outputting the bit pass/failure information of each storage cell for each of the plurality of grades, if it is satisfied that the page pass/failure information of a page including a bit corresponding to that storage cell indicating that this page meets the condition of that grade is stored in the second failure memory, outputting the bit pass/failure information output from the first failure memory and indicating that that storage cell is defective, by changing the bit pass/failure information to a value indicating that that storage cell is not defective.

According to one exemplary test apparatus according to an aspect related to the innovation included herein, there is provided a test apparatus which tests a memory under test having, in each of its pages, a function of correcting one or a plurality of bit error(s), the test apparatus including: a test processing section which writes a data sequence for testing purposes into the memory under test, and reads out the written data sequence page by page; a first failure memory which receives the data sequence read out page by page, compares the data sequence with a predetermined expectation value sequentially to generate bit pass/failure information indicating whether each storage cell is good or defective, and stores the bit pass/failure information; and a grading section which operates in parallel with a storing operation to the first failure memory to generate judgment information indicating whether error correction is unavailable, correction of one bit error is available, or correction of a plurality of bit errors is available, based on a count value obtained by counting, for each page, a number of bits that do not match the expectation value.

The above summary of the invention is not the listing of all necessary features of the present invention, but sub-combinations of these features can also provide an invention.

DESCRIPTION OF EXEMPLARY EMBODIMENTS

One aspect of the present invention will be explained below through embodiments of the invention. However, the embodiments below are not intended to limit the invention set forth in the claims, or all the combinations of the features described in the embodiments are not necessarily essential to the means of solving provided by the invention.

Figure 1:
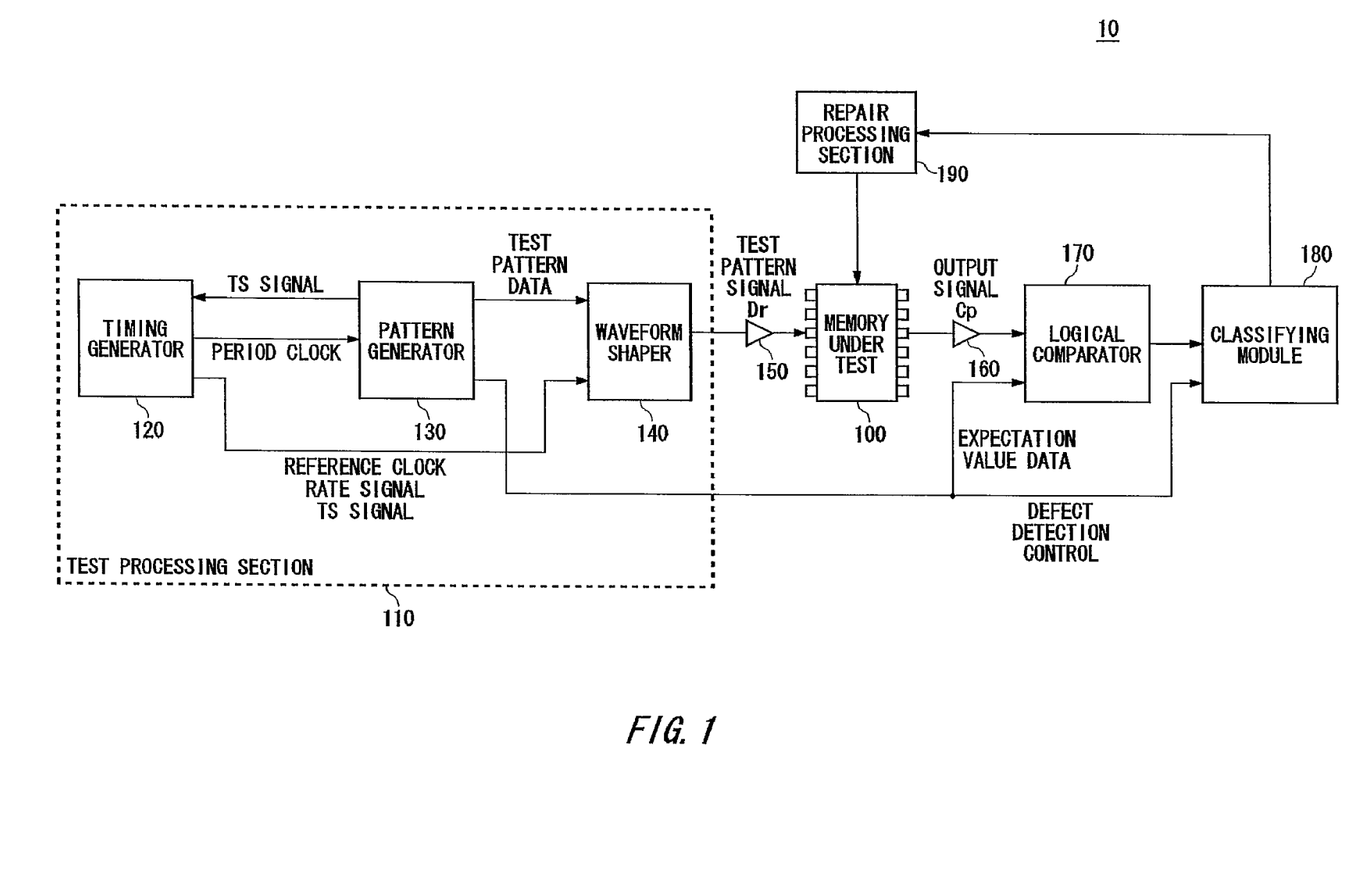
FIG. 1 illustrates the configuration of a test apparatus 10 according to an embodiment of the present invention.

FIG. 1 illustrates the configuration of a test apparatus 10 according to an embodiment of the present invention. The test apparatus 10 tests the memory function of a memory under test 100. Here, the memory under test 100 is, for example, a semiconductor memory, an SoC (System-on-Chip) additionally having a memory function, or the like, and stores data sequences to which error check and corrections are affixed. The test apparatus 10 according to the present embodiment does not judge a memory under test 100 as defective even in a case where a data sequence read out from this memory under test 100 does not match an expectation value data sequence, but on a condition that the errors can be corrected with the error check and correction. Further, even in a case where the data sequence included in each page can be corrected with the error check and correction, the test apparatus 10 classifies the page into any grade according to the number of errors that have occurred in the page. Then, the test apparatus 10 outputs, grade by grade, bit pass/failure information indicating each erroneous bit that has occurred in each page. At this time, in a case where the number of errors that have occurred in each page satisfies the condition for a certain grade, the test apparatus does not output the intended bit pass/failure information but bit pass/failure information that indicates that no bit failure has occurred at all. As a result, in the repair process corresponding to the grades, the work of analyzing the output bit pass/failure information can be omitted. As known from this, the test apparatus 10 aims for appropriate judgment of the quality of each page of the memory under test 100 and for a consequent efficient analyzing process. An example case will be explained below, where the memory under test 100 is a flash memory.

The test apparatus 10 comprises a test processing section 110, a driver 150, a comparator 160, a logical comparator 170, a classifying module 180, and a repair processing section 190. The test processing section 110 controls testing of the memory under test 100. Specifically, in testing the memory under test 100, the test processing section 110 writes a data sequence into the storage area of each page, which is the unit of error correction, and then reads out the data sequence from the storage area of that page. Then, the test processing section 110 supplies the data read out from the memory under test 100 to the logical comparator 170. In this manner, the test processing section 110 writes and reads a data sequence to and from the same storage area while changing the data sequence, thereby allowing the logical comparator 170 and the classifying module 180 to detect any defect in the storage cells in that storage area.

The test processing section 110 comprises a timing generator 120, a pattern generator 130, and a waveform shaper 140. The timing generator 120 generates a period clock indicating one cycle of a test and a RATE signal indicating the timing to start a test cycle, by using timing data designated by a timing set signal (TS signal) output from the pattern generator 130. Then, the timing generator 120 supplies the period clock to the pattern generator 130 and supplies the RATE signal and the TS signal together with the reference clock of the test apparatus 10 to the waveform shaper 140.

The pattern generator 130 generates, based on the period clock, data representing test patterns to be supplied to the memory under test 100, and supplies the data to the waveform shaper 140. This test pattern data includes a test pattern comprising a signal to be supplied to the memory under test 100 for a data sequence to be written into the memory under test 100, and a test pattern comprising a signal to be supplied to the memory under test 100 for the written data sequence to be read out from the memory under test 100.

The waveform shaper 140 shapes the test pattern data to a waveform to match the timing at which the test pattern data should be supplied to the memory under test 100, based on the reference clock, the RATE signal, and the TS signal.

The driver 150 supplies the test pattern data shaped by the waveform shaper 140 to the memory under test 100 as a test pattern signal. The comparator 160 compares an output signal, which is output from the memory under test 100 in response to the test pattern, with a predetermined reference voltage, to obtain the logical value of the output signal.

The logical comparator 170 compares each data included in the data sequence read out from the memory under test 100 in response to the test pattern with an expectation value generated in advance by the pattern generator 130. The classifying module 180 classifies the memory under test 100 into any of a plurality of grades or judges whether the memory under test 100 is defective or not, based on the result of comparison by the logical comparator 170. The repair processing section 190 performs a repair process for replacing any defective storage cell with a spare storage cell, based on page-by-page bit pass/failure information output from an output section 380 of the classifying module 180.

Figure 2:
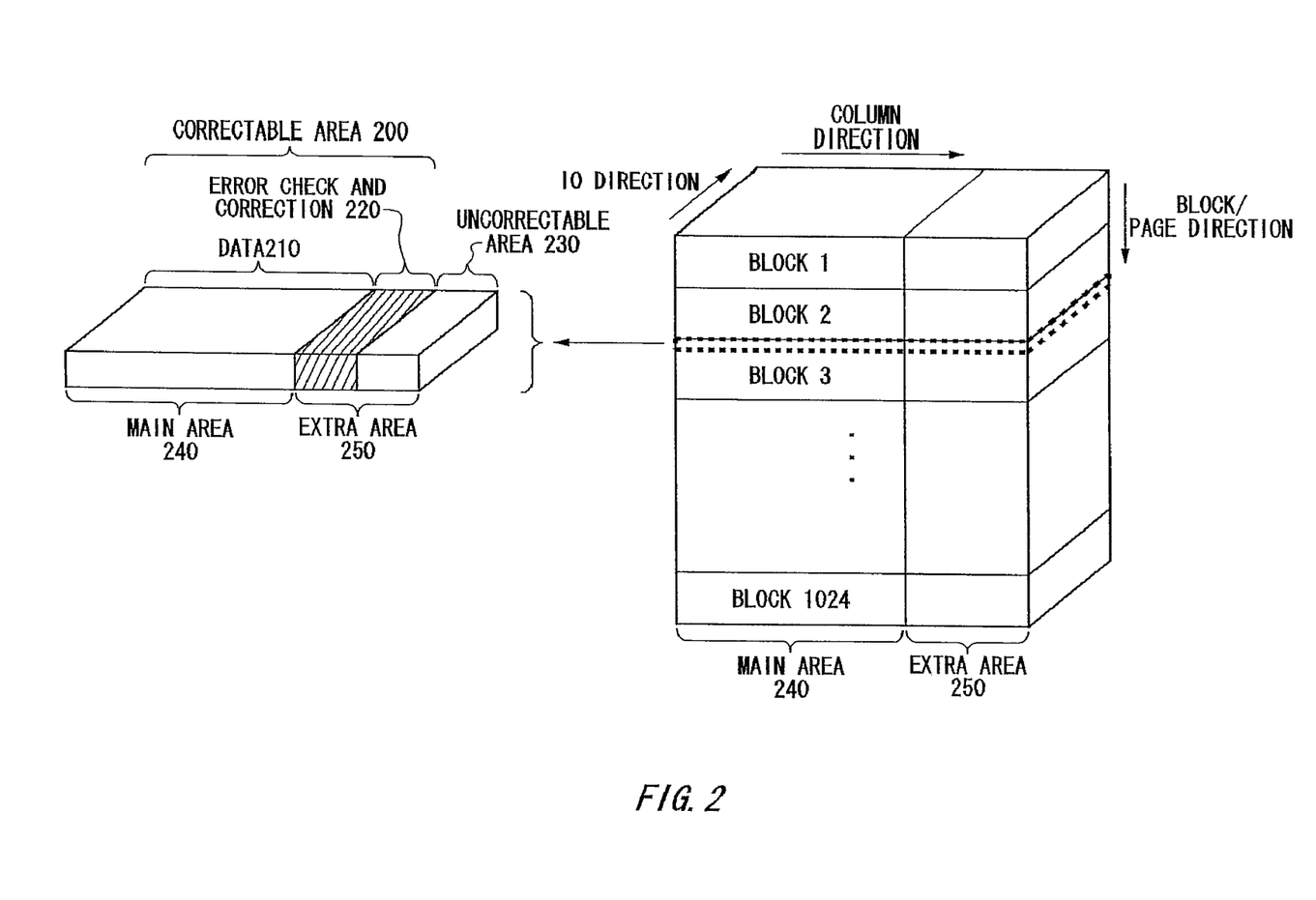
FIG. 2 illustrates the storage area of a memory under test 100 according to the embodiment of the present invention.

FIG. 2 illustrates the storage area of the memory under test 100 according to the embodiment of the present invention. The storage area of the memory under test 100 according to the present embodiment is divided into a plurality of blocks. Each block has a data storage capacity of, for example, 64 KBs, and includes a plurality of, for example, 32 pages. The memory under test 100 according to the present embodiment has a data sequence read out or written therefrom or thereto, in the unit of page, which has a data storage capacity of, for example, 2 KBs. To be more specific, the memory under test 100 has a plurality of data IO terminals which amount to, for example, 8 bits, and transfers data of 1 word (for example, 8 bits) in each input/output cycle through these plurality of data IO terminals. Thus, in one reading or writing operation, the memory under test 100 has data read out or written in the page unit, by transferring one word in a page after another by turns in the column direction.

The storage area in the memory under test 100 includes a main area 240 and an extra area 250. The main area 240 is an area which stores data 210 that the memory under test 100 is meant to store. The extra area 250 is an area which stores an error check and correction 220 for correcting any bit error that has occurred in the data 210, information indicating prohibition against the use of the page concerned, and the like. Further, from the viewpoint of error correctability, the storage area of the memory under test 100 is divided into a correctable area 200 and an uncorrectable area 230. The correctable area 200 is one example of a first storage area according to the present invention, and an area which stores the data 210 and the error check and correction 220 thereby storing a data sequence which is affixed with the error check and correction. In an actual use of the memory under test 100, even if any bit error occurs in the correctable area 200, a memory controller connected to the memory under test 100 to control the memory under test 100 can correct any error that is within the limit in which errors can be corrected with the error check and correction 220. On the other hand, the uncorrectable area 230 is one example of a second storage area according to the present invention, and an area which stores a data sequence affixed with no error check and correction. The memory controller cannot correct any error that occurs in the uncorrectable area 230.

Figure 3:
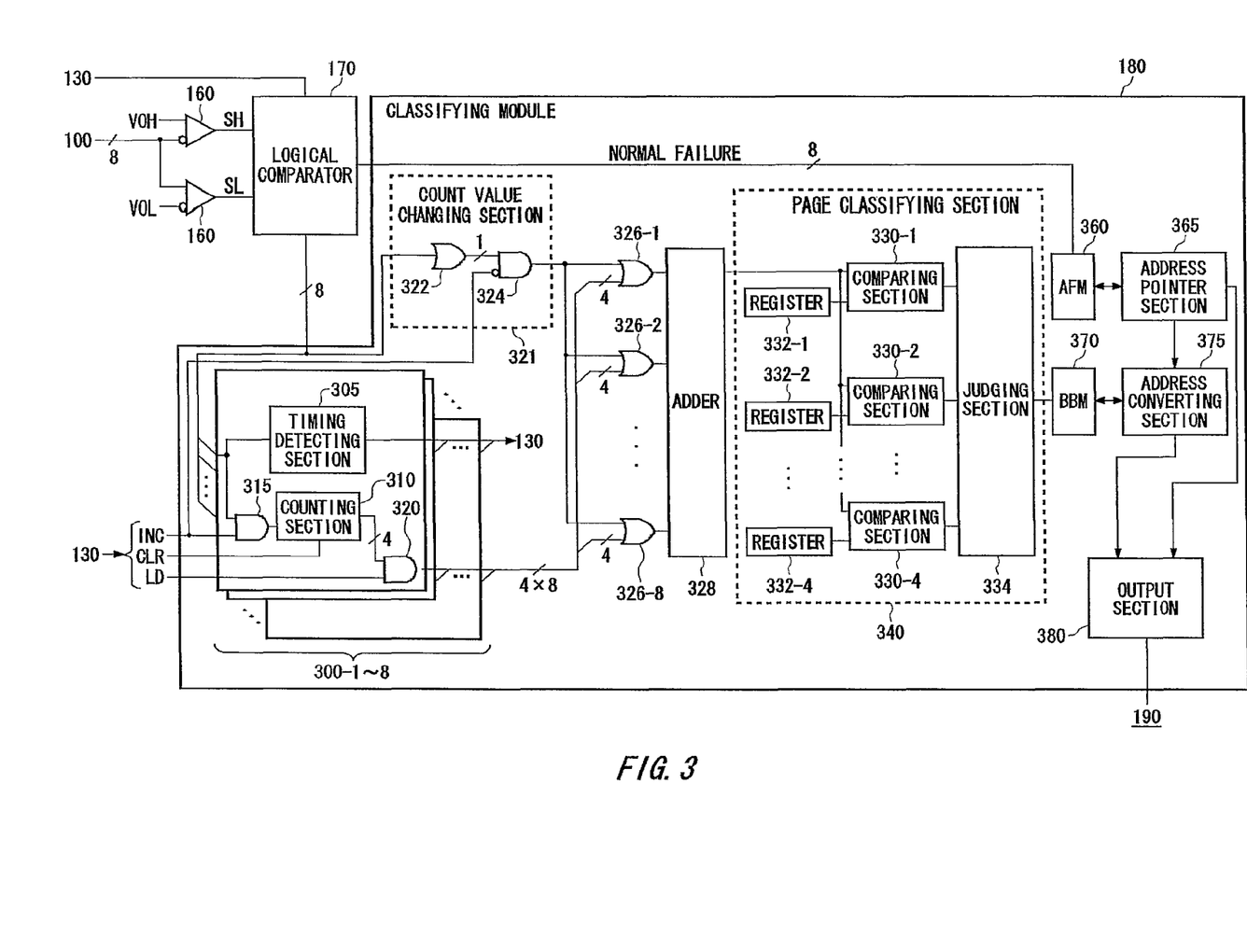
FIG. 3 illustrates the configuration of a classifying module 180 according to the embodiment of the present invention, together with a comparator 160 and a logical comparator 170.

FIG. 3 illustrates the configuration of the classifying module 180 according to the embodiment of the present invention, together with the comparator 160 and the logical comparator 170. For each of a plurality of data sequences read out from different storage areas of the memory under test 100, the comparator 160 sequentially receives data of every 8 bits included in that data sequence from the data IO terminals of the memory under test 100, and compares the voltage input from each bit with a threshold voltage VOH indicating a logical value H and with a threshold voltage VOL indicating a logical value L. Then, for each bit, the comparator 160 outputs SH=1 in a case where the bit has the logical value H, or outputs SL=1 in a case where the bit has the logical value L.

The logical comparator 170 tests the memory under test 100 about a plurality of different subjects. In a first test, the logical comparator 170 tests whether data can be correctly written in each bit of the memory under test 100. In this test, for each of a plurality of data sequences, the logical comparator 170 sequentially compares each data included in that data sequence with an expectation value. Specifically, the logical comparator 170 according to the present embodiment compares data amounting to 1 word (=8 bits) with expectation values amounting to 1 word bit by bit in each input/output cycle, and outputs the result of comparison indicating any matched bit as 0 (a signal indicating a pass) while indicating any mismatched bit as 1 (a signal indicating a failure), as a pass/failure signal.

In a second test, the logical comparator 170 tests the timing at which data in each bit is read out from the memory under test 100. In this test, for example, for each bit included in the data sequence, the logical comparator 170 compares data indicating a changing value of that bit, which data is output from the memory under test 100 at a timing a preset period after a request for reading the data is issued to the memory controller of the memory under test 100, with a predetermined logical value a plurality of times. By this operation, the logical comparator 170 can give, for example, 100 times of comparison for each bit and check how many times out of these comparisons the bit matches the logical value, and can therefore test the timing at which the data is read out.

The classifying module 180 comprises processing sections 300-1 to 8, a count value changing section 321, OR gates 326-1 to 8, an adder 328, a page classifying section 340, an AFM 360, an address pointer section 365, a BBM 370, an address converting section 375, and an output section 380. Each of the processing sections 300-1 to 8 receives the bit-by-bit pass/failure signal from the logical comparator 170. That is, for example, the processing section 300-1 receives the pass/failure signal for the first bit of the data of 1 word, and the processing sections 300-2 to 8 receive the pass/failure signals for the second to eighth bits respectively.

The processing section 300-1 includes a timing detecting section 305, a counting section 310, an AND gate 315, and an AND gate 320. The timing detecting section 305 is prepared for the above-described second test, and based on the received pass/failure signals, computes the ratio of the number of times the value of each bit matches the predetermined logical value to the number of times the bit is compared with the predetermined logical value. Then, the timing detecting section 305 detects the timing at which the value of the bit changed, based on the ratio. For example, if the bit matches the predetermined logical value 50 times out of 100 times of comparison, the timing detecting section 305 judges that the data of the bit changed at the timing the preset period after the reading request was issued.

The AND gate 315 outputs the logical product of a pass/failure signal of each bit and an INC signal indicating a period during which the number of failure signals is captured, to the counting section 310. Hence, the AND gate 315 supplies pass/failure signals to the counting section 310 for the period during which the number of failure signals should be captured, whereas supplies a value 0 to the counting section 310 for the period during which the number of failure signals is not captured. The counting section 310 functions as a data error counting section according to the present invention, in cooperation with the adder 328 to be described later. For each data sequence read out from the memory under test 100, the counting section 310 counts the number of data that do not match the expectation value generated in advance, of the data included in that data sequence. Here, there may be a limitation on the number of failure signals that can be counted up by the counting section 310. For example, the counting section 310 may record the number of data bits that do not match the expectation value by using 4 bits, and stop adding any further value to the counter when the number of failure signals counted gets to 15. The counting section 310 initializes the count value, i.e., returns the count value to 0 when a CLR signal is input from the pattern generator 130.

Note that the processing sections 300-2 to 8 perform generally the same operation as that of the processing section 300-1 described above, for the second to eighth bits respectively. The specific configuration of theirs is generally the same as that of the processing section 300-1, and the explanation thereof is thus omitted.

The AND gate 320 outputs, when an LD signal is input from the pattern generator 130, the logical product of the counter value and the LD signal (i.e., the logical product being the very counter value) to the OR gate 326-1. Each of the OR gates 326-1 to 8 obtains the logical product of the input counter value and an output from the AND gate 324, and outputs the obtained logical product to the adder 328. The output from the AND gate 324 will be described in detail later, but note that the output from the AND gate 324 will take a value 0 when the INC signal has a logical value "1", giving no influence on the output from the OR gates 1 to 8. The adder 328 sums the counter values output from the OR gates 326-1 to 8 for each page, and outputs the sum to the page classifying section 340.

The page classifying section 340 judges, for each of a plurality of grades into which the memory under test 100 may be classified based on its quality, whether or not the number of bits that do not match the expectation value meets the condition of that grade, for each page. Specifically, the page classifying section 340 includes registers 332-1 to 4, comparing sections 330-1 to 4, and a judging section 334. The registers 332-1 to 4 are prepared correspondingly to the plurality of grades, into which the memory under test 100 may be classified based on its quality. Each of the registers 332-1 to 4 stores the upper limit value of the number of errors included in a given page of a memory under test 100, which is to be classified into the corresponding grade. Each of the comparing sections 330-1 to 4 compares a corresponding one of the plurality of upper limit values stored in the registers 332-1 to 4, with the count value having been counted by the counting section 310 and summed by the adder 328. The judging section 334 judges that the page that stores the data sequence read out from the memory under test 100 meets the condition of any grade, on the condition that the count value of that data sequence is equal to or lower than the upper limit value of that grade.

In a case where the INC signal has a logical value "0", the test apparatus 10 operates in an operation mode in which it detects any memory under test 100 as defective if there is any data that does not match the expectation value, regardless of the number of bits that produce failure signals. In this operation mode, in a case where there is any data that does not match the expectation value, the count value changing section 321 outputs a value that is greater than any of the upper limit values stored in the registers 332-1 to 4, as a count value. As specific elements that realize this operation mode, the count value changing section 321 includes an OR gate 322 and an AND gate 324. The OR gate 322 receives a pass/failure signal for each of the first to eighth bits from the logical comparator 170, and outputs the logical sum of theirs to the AND gate 324. That is, if any of the first to eighth bits is detected as a failure, a logical value "1" is output to the AND gate 324. The AND gate 324 obtains the logical product of the output from the OR gate 322 and the negation of the INC signal input from the pattern generator, and outputs the obtained logical product to each of the OR gates 326-1 to 8. Since the OR gates 326-1 to 8 each receive a logical value "1" as an input, they output the greatest value that can be represented with 4 bits (the greatest value being 15) to the adder 328. Then, the adder 328 outputs the sum of these greatest values to the comparing sections 330-1 to 4. In this way, the count value changing section 321 can have a value greater than any of the upper limit values stored in the registers 332-1 to 4 outputted to the comparing sections 330-1 to 4 as a count value. In this case, the results of comparison by the comparing sections 330-1 to 4 is just the same as those obtained in a case where the counting section 310 outputs a value greater than any of the upper limit values stored in the registers 332-1 to 4.

The AFM (address failure memory) 360 is one example of a first failure memory according to the present invention, and stores bit pass/failure information indicating, for each storage cell of the memory under test 100, whether the storage cell has passed or failed the test, based on the result of comparison by the logical comparator 170. The BBM (bad block memory) 370 is one example of a second failure memory according to the present invention, and outputs page pass/failure information indicating, for each page, whether the page has passed or failed each of the plurality of grades, by changing the information to a value indicating that the storage cell concerned is not defective, based on the result of judgment by the page classifying section 340. The address pointer section 365 sequentially outputs one first address after another, which is for sequentially reading out the bit pass/failure information for each storage cell stored in the AFM 360. Thereby, the bit pass/failure information is sequentially read out from the AFM 360 and supplied to the output section 380. The address converting section 375 acquires some bits from an address output from the address pointer section 365 and outputs a second address, which is for reading out the page pass/failure information stored in the BBM 370, of a page including the storage cell corresponding to the acquired address. That is, for example, a second address represents a predetermined number of most significant bits of a first address. Thereby, the page pass/failure information is sequentially read out from the BBM 370 and supplied to the output section 380.

The output section 380 outputs the bit pass/failure information of each storage cell, for each of the plurality of grades. In this case, with respect to each of the plurality of grades, if it is satisfied that the page pass/failure information of a age including a bit corresponding to each storage cell indicating that this page meets the condition of that grade is stored in the BBM 370, the output section 380 changes the bit pass/failure information output from the AFM 360 indicating that that storage cell is defective to a value indicating that this storage cell is not defective, and outputs the thusly changed bit pass/failure information. That is, for example, in a case where an error that has occurred in a given page meets the condition of a certain grade, the bit pass/failure information of that page with respect to that grade is output as changed to bit pass/failure information implying that there is no error in that page.

The process of the output section 380 is to be explained in more detail. First, the output section 380 reads out the page pass/failure information, which takes a logical value H if the page concerned is defective or a logical value L if the page concerned is not defective, from a second address in the BBM 370. Then, the output section 380 reads out the bit pass/failure information, which takes a logical value H if the storage cell concerned is defective or a logical value L if the storage cell concerned is not defective, from a first address in the AFM 360. Then, the output section 380 outputs the logical product of the bit pass/failure information read out for each storage cell and the page pass/failure information of the page including that storage cell, as the bit pass/failure information of that storage cell. The output bit pass/failure information is supplied to the repair processing section 190 and used for a repair process with no analysis needed.

Figure 4:
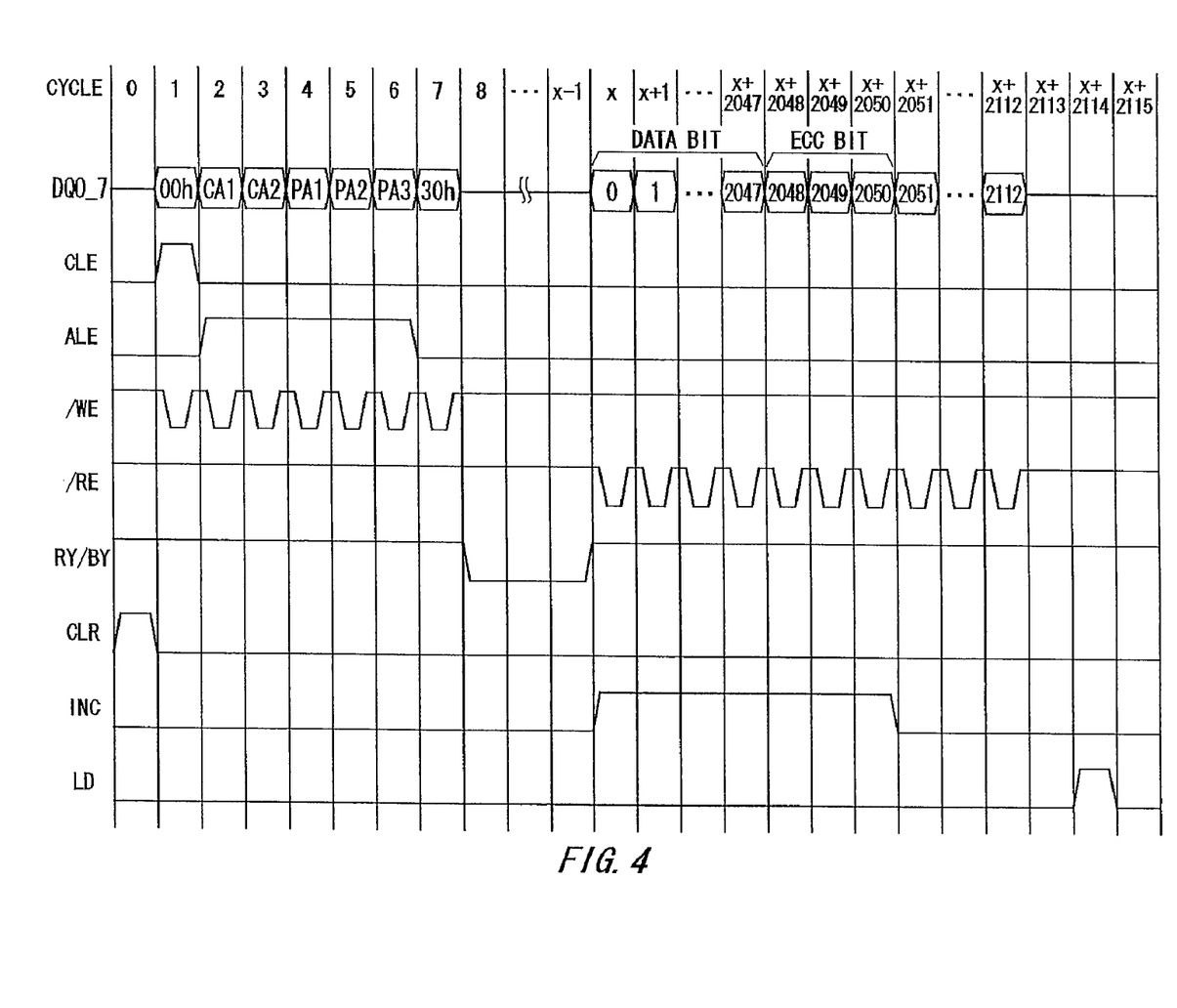
FIG. 4 shows operational timings of the test apparatus 10 according to the embodiment of the present invention.

FIG. 4 shows operational timings of the test apparatus 10 according to the embodiment of the present invention. The test processing section 110 writes test data into each page of the memory under test 100. Then, the test processing section 110 reads out the written data from each page and compares it with the expectation value. FIG. 4 shows the operational timings, at which data written into a given page is read out from the memory under test 100 and compared with the expectation value.

First, before a new data sequence is read out and compared with the expectation value, the pattern generator 130 gives a CRL signal having a value "1" to initialize the count value of the counting section 310 (cycle 0). Next, the test processing section 110 supplies a "read memory" command to the memory under test 100 based on test pattern data (cycles 1 to 7). To be more specific, the test processing section 110 supplies the command in the cycle 1, a column address in the cycles 2 to 3, and a page address in the cycles 4 to 6, thereby starting reading the memory under test 100.

Next, in response to the "read memory" command, the memory under test 100 outputs the data included in the data sequence stored in the designated page, word by word sequentially (cycles x to x+2112). Here, the memory under test 100 outputs the data 210 in the correctable area 200 in the cycles x to x+2047, and the error check and correction 220 in the correctable area 200 in the cycles x+2048 to 2050. Since these data can be corrected by the error check and correction, the pattern generator 130 gives an INC signal having a value "1". Thereby, the OR gate 322 and the gate 324 are prohibited from giving notification of a single bit error. Further, the AND gate 315 and the counting section 310 start counting the number of failure bits. As a result, the classifying section 380 can detect the memory under test 100 as defective, in a case where the count value of the data sequence read out from the correctable area 200 exceeds the upper limit value, which represents the maximum number of errors included in a data sequence that can be corrected by the error check and correction.

Next, the memory under test 100 outputs the data in the uncorrectable area 230 in the cycles x+2051 to x+2112. Since these data cannot be corrected, the pattern generator 130 gives an INC signal having a value "0". Thereby, the OR gate 322 and the gate 324 are allowed to give notification of a single bit error. Further, the AND gate 315 and the counting section 310 stop counting the number of failure bits. As a result, the classifying section 380 can detect the memory under test 100 as defective, in a case where, for a data sequence read out from the uncorrectable area 230, at least one data included in that data sequence does not match the expectation value.

Next, when the comparison between the data sequence and the expectation value data sequence is completed, the pattern generator 130 gives an LD signal having a value "1". In response to this, the count value of the counting section 310 is supplied to the adder 328 through the OR gates 326-1 to 8. In response to this, the comparing sections 330-1 to 4 compare this count value with the upper limit values stored in the registers 332-1 to 4 respectively. The results of this comparison are stored in the BBM 370. Further, based on the results of this comparison, the judging section 334 can judge whether each page of the memory under test 100 meets the condition of each grade.

Through the above-described process, the test apparatus 10 can read out the data sequence written into the memory under test 100, and detect the memory under test 100 as defective regarding this data sequence or classify each page of the memory under test 100 into any grade. Then, when defect detection on a given data sequence is completed, the test processing section 110 gives a CLR signal having a value "1" to initialize the count value in the counting section 310. Then, the pattern generator 130 makes the logical comparator 170 start comparison with the expectation value for the next data sequence.

Figure 5:
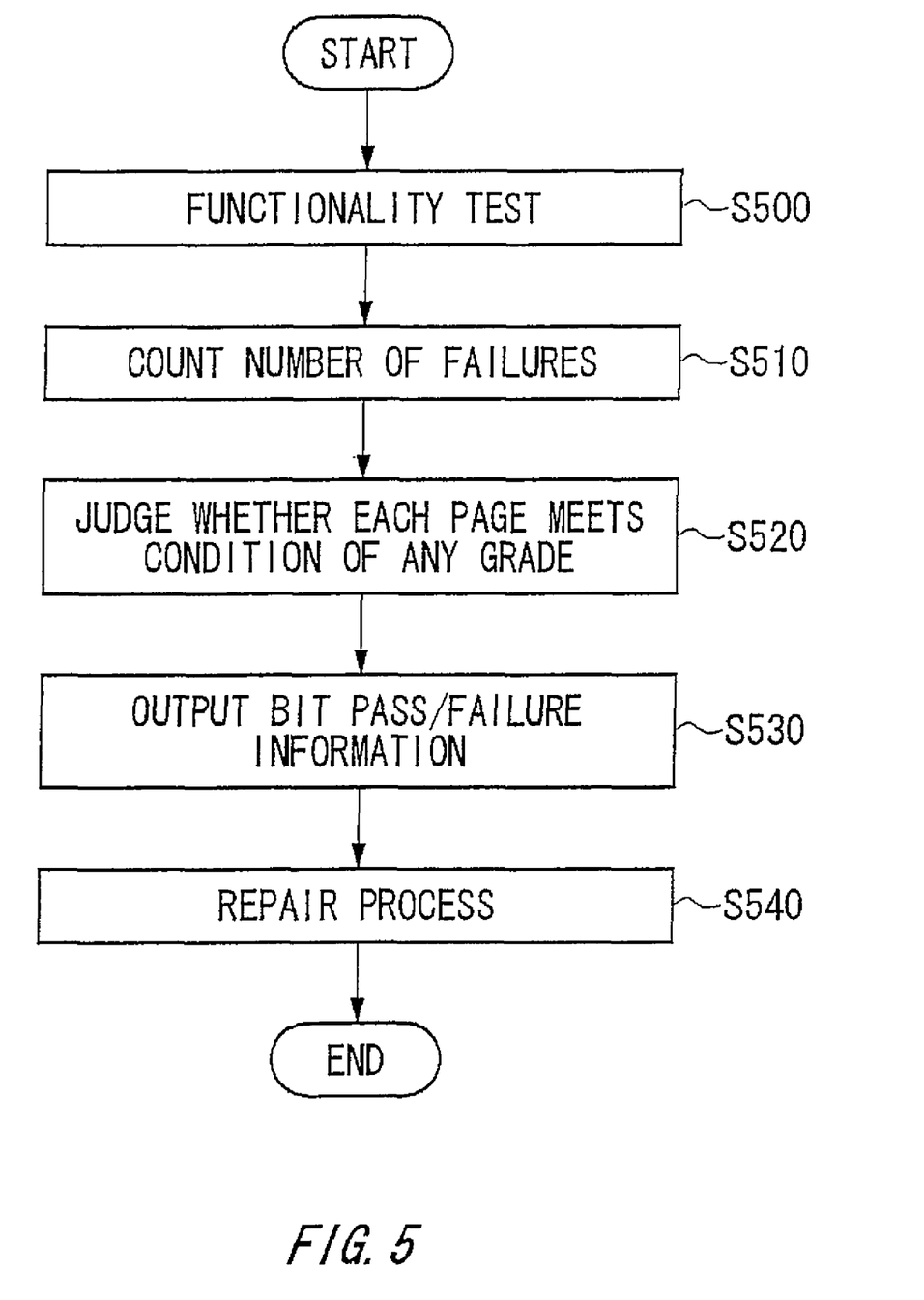
FIG. 5 shows the flow of a process in which a memory under test 100 is tested by the test apparatus 10 according to the embodiment of the present invention, and the result thereof is output.

FIG. 5 shows the flow of a process in which the memory under test 100 is tested by the test apparatus 10 according to the embodiment of the present invention and the result thereof is output. The test apparatus 10 performs a functionality test for reading out the data sequence stored in each bit of the memory under test 100 and comparing it with the expectation value data sequence (S500). Specifically, first, for each page as the unit of error correction, the test processing section 110 reads out the data sequence stored in that page from the memory under test 100. Then, the logical comparator 170 compares the value of each bit included in the data sequence read out from the memory under test 100 with the expectation value of that bit. Then, based on the result of comparison by the logical comparator 170, the AFM 360 stores bit pass/failure information indicating for each storage cell of the memory under test 100 whether that storage cell is good or defective.

Next, the counting section 310 and the adder 328 count the number of bits that do not match the expectation value page by page (S510). Then, the page classifying section 340 judges page by page whether the number of bits that do not match the expectation value meets the condition of each of the plurality of grades into which the memory under test 100 is classified based on its quality (S520). The output section 380 outputs the bit pass/failure information of each page grade by grade (S530). At this time, in a case where, regarding a given grade and a given page, the number of failures that have occurred in that page meets the condition of that grade, the bit pass/failure information of that page is output as changed to bit pass/failure information obtained in a case where no failure at all has occurred. Then, the repair processing section 190 performs a repair process for replacing defective storage cells with called storage cells, based on the bit pass/failure information of each page output from the output section 380 (S540).

Figure 6:
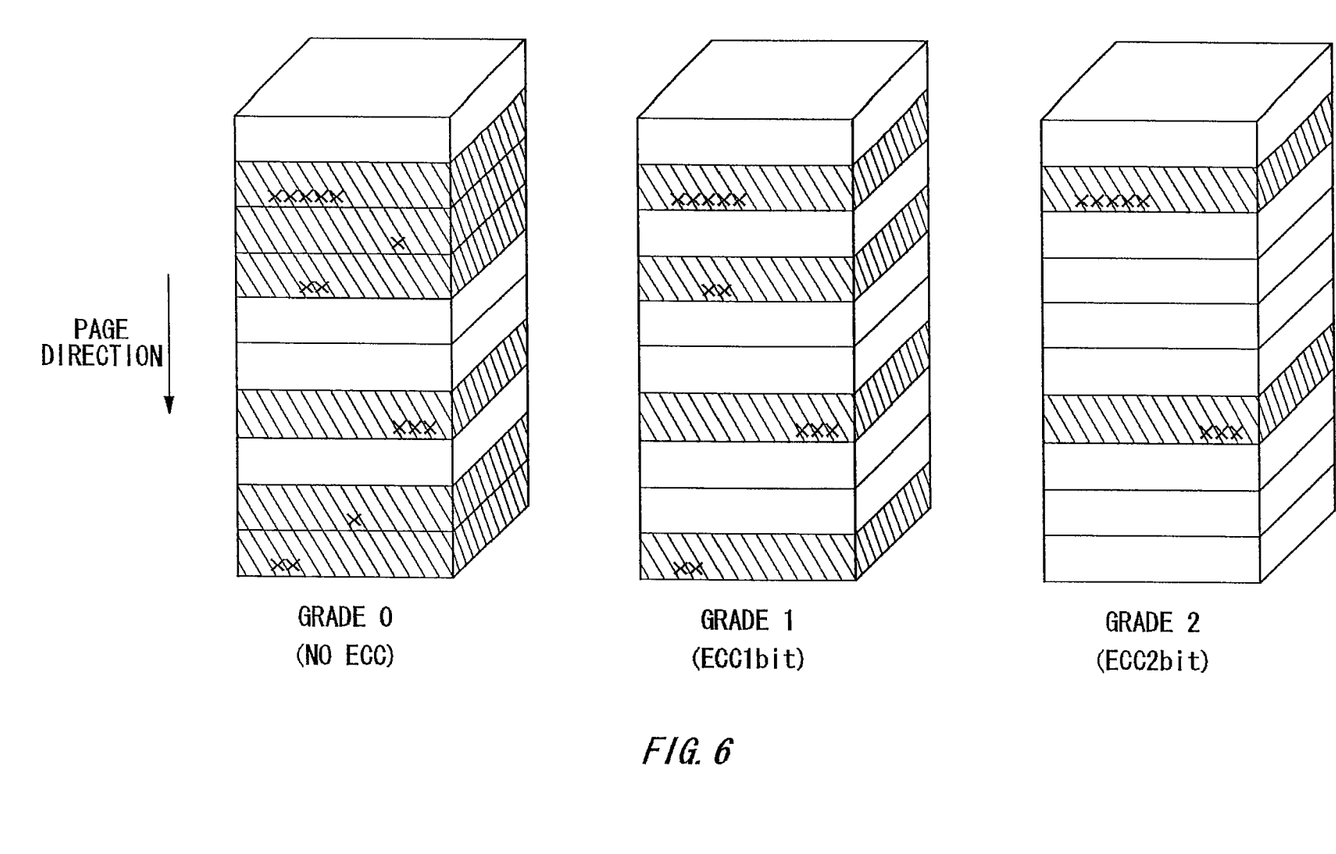
FIG. 6 shows one example of a test result output from the test apparatus 10 according to the embodiment of the present invention.

FIG. 6 illustrates an example of a test result output from the test apparatus 10 according to the embodiment of the present invention. The steric figures in this drawing represent the aggregation of storage cells in the memory under test 100. Each plane constituting the steric figures represents a page of the memory under test 100. The symbol x in the drawing represents the storage cell from which a defect has been detected. The grade 0 represents a quality with which normal operability is guaranteed even in a case where no correction by the error check and correction (ECC) is available. The grade 1 represents a quality with which normal operability is guaranteed in a case where one bit error can be corrected per page by the error check and correction. The grade 2 represents a quality with which normal operability is guaranteed in a case where two bit errors can be corrected per page by the error check and correction.

At the grade 0, if there is only one defective cell at all in a given page, the page pass/failure information of that page indicates it as defective. Accordingly, for the grade 0, the output section 380 just outputs the bit pass/failure information. That is, in this drawing, if there exists one symbol x at all in a given page, this page is judged as defective. On the other hand, at the grade 1, even if there is not more than one defective storage cell in a given page, the page pass/failure information of that page indicates it as good. Hence, for any page that includes only one defective storage cell, the output section 380 does not just output the bit pass/failure information of that page. Instead, the output section 380 outputs bit pass/failure information of the case where no defect has occurred in that page. In the drawing, the third and ninth pages as counted from the top are such pages.

At the grade 2, even if there are not more than two defective storage cells in a given page, the page pass/failure information of that page indicates it as good. Hence, for any page that includes not more than two defective storage cells, the output section 380 does not just output the bit pass/failure information of that page. Instead, the output section 380 outputs bit pass/failure information of the case where no defect has occurred in that page. In the drawing, the third, fourth, ninth, and tenth pages as counted from the top are such pages.

In this manner, for any page that meets any of the grades, the output section 380 outputs bit pass/failure information of the case where no defect has occurred in that page, instead of the original bit pass/failure information of that page. This enables the repair processing section 190, which uses this output, to acquire only such bit pass/failure information that is about any page that requires a repair process, while omitting a process for analyzing and judging which page requires a repair process.

One aspect of the present invention has thus been described above using an embodiment, but the technical scope of the present invention is not limited to the above-described embodiment. Various modifications or alterations can be made upon the above-described embodiment. It is obvious from the statements of the claims that an embodiment upon which such modifications or alterations are made can also be included in the technical scope of the present invention.

What is claimed is:

1. A test apparatus which tests a memory under test storing, in each of its pages, a data sequence affixed with an error check and correction code, the test apparatus comprising:
    a test processing section which reads out, for each page, which is a unit of error correction, the data sequence stored in that page from the memory under test;
    a logical comparator which compares a value of each bit included in the data sequence read out from the memory under test with an expectation value of that bit;
    a first failure memory which stores, for each storage cell of the memory under test, bit pass/failure information indicating whether the storage cell is good or defective, based on a result of comparison by the logical comparator;
    a data error counting section which counts, for each page, a number of bits that do not match the expectation value;
    a page classifying section which judges, for each page and for each of a plurality of grades into which the memory under test is classified based on its quality, whether the number of bits that do not match the expectation value meets a condition of that grade;
    a second failure memory which stores, for each of the plurality of grades, page pass/failure information indicating whether each page is good or defective, based on a result of judgment by the page classifying section; and
    an output section which, in outputting the bit pass/failure information of each storage cell for each of the plurality of grades, if page pass/failure information indicating that a page including a bit corresponding to the storage cell meets the condition of that grade is stored in the second failure memory, changes the bit pass/failure information output from the first failure memory indicating that the storage cell is defective to bit pass/failure information indicating that the storage cell is not defective and outputs the changed bit pass/failure information,
    wherein the page classifying section comprises:
        a plurality of registers which are prepared correspondingly to the plurality of grades, and which respectively store upper limit values of a number of errors included in a page of the memory under test;
        a comparing section which compares each of the plurality of upper limit values stored in the plurality of registers with a count value of the data error counting section; and
        a judging section which, on a condition that the count value of the data sequence read out from the memory under test is equal to or smaller than the upper limit value, judges that the page which stores that data sequence meets the condition of the grade corresponding to that upper limit value.

2. The test apparatus according to claim 1, further comprising:
    an address pointer section which sequentially outputs a first address, which is stored in the first failure memory, and which is for sequentially reading out the bit pass/failure information of each storage cell; and
    an address converting section which acquires some bits from the address output from the address pointer section, and outputs a second address which is for reading out the page pass/failure information, stored in the second failure memory, of a page including a storage cell corresponding to the address output from the address pointer section,
    wherein the output section outputs a logical product of the page pass/failure information and the bit pass/failure information, the page pass/failure information being read out from the second address in the second failure memory and which takes a logical value H in a case where the page concerned is defective and takes a logical value L in a case where the page concerned is not defective, and the bit pass/failure information being read out from the first address in the first failure memory and which takes a logical value H in a case where the storage cell concerned is defective and takes a logical value L in a case where the storage cell concerned is not defective, as the bit pass/failure information of the storage cell concerned.

3. The test apparatus according to claim 1, further comprising a repair processing section which performs a repair process for replacing a defective storage cell with a spare storage cell, based on the bit pass/failure information of each page output from the output section.

4. A test method for testing a memory under test which stores, in each of its pages, a data sequence affixed with an error check and correction code, the test method comprising:

reading out, for each page, which is a unit of error correction, the data sequence stored in that page from the memory under test;

comparing a value of each bit included in the data sequence read out from the memory under test with an expectation value of that bit;

storing, for each storage cell of the memory under test, bit pass/failure information indicating whether that storage cell is good or defective in a first failure memory, based on a result of comparison;

counting a number of bits that do not match the expectation value, for each page;

judging, for each page and for each of a plurality of grades into which the memory under test is classified based on its quality, whether the number of bits that do not match the expectation value meets a condition of that grade;

storing, for each of the plurality of grades, page pass/failure information indicating, whether each page is good or defective in a second failure memory, based on a result of judgment;

in outputting the bit pass/failure information of each storage cell for each of the plurality of grades, if page pass/failure information indicating that a page including a bit corresponding to the storage cell meets the condition of that grade is stored in the second failure memory, changing the bit pass/failure information output from the first failure memory indicating that the storage cell is defective to bit pass/failure information indicating that the storage cell is not defective and outputting the changed bit pass/failure information;

storing an upper limit value, which is prepared correspondingly to each of the plurality of grades, and which indicates an upper limit of a number of errors included in a page of the memory under test;

comparing the count value of the data error counting section with each of the plurality of upper limit values stored; and judging that the page storing the data sequence read out from the memory under test meets the condition of any grade corresponding to any upper limit value, if the count value for the data sequence is equal to or lower than that upper limit value.

5. The test method according to claim 4, comprising:

sequentially outputting a first address for sequentially reading out the bit pass/failure information of each storage cell stored in the first failure memory;

acquiring some bits from an address output from a member which outputs the first address, and outputting a second address for reading out the page pass/failure information, stored in the second failure memory, of a page including a storage cell corresponding to the address output from the member which outputs the first address;

outputting a logical product of the page pass/failure information and the bit pass/failure information, the page pass/failure information being read out from the second address in the second failure memory and which takes a logical value H in a case where the page concerned is defective and takes a logical value L in a case where the page concerned is not defective, and the bit pass/failure information being read out from the first address in the first failure memory and which takes a logical value H in a case where the storage cell concerned is defective and takes a logical value L in a case where the storage cell concerned is not defective, as the bit pass/failure information of the storage cell concerned.

6. The test method according to claim 4, comprising performing a repair process for replacing a defective storage cell with a spare storage cell, based on the output bit pass/failure information of each page.

\* \* \* \* \*